(12) United States Patent
Hung et al.

(10) Patent No.: US 6,411,120 B1
(45) Date of Patent: Jun. 25, 2002

(54) OUTPUT BUFFER DRIVE CIRCUIT WITH INITIAL DRIVE FOR SEMICONDUCTOR DEVICES

(75) Inventors: Shuo-Nan Hung, Tainan; Chun Hsiung Hung, Hsinchu, both of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/562,505

(22) Filed: May 1, 2000

(51) Int. Cl.[7] .................. H03K 17/16; H03K 19/0175
(52) U.S. Cl. ............................. 326/27; 326/83
(58) Field of Search .................. 326/83, 86, 112, 326/119, 121, 26, 27

(56) References Cited

U.S. PATENT DOCUMENTS

| | | | | |
|---|---|---|---|---|
| 5,623,216 A | * | 4/1997 | Penza et al. | 326/27 |
| 5,912,569 A | * | 6/1999 | Alleven | 327/108 |
| 6,043,682 A | * | 3/2000 | Dabral et al. | 326/86 |
| 6,236,248 B1 | * | 5/2001 | Koga | 327/112 |

FOREIGN PATENT DOCUMENTS

EP         000585505      *  3/1994

* cited by examiner

*Primary Examiner*—Michael Tokar
*Assistant Examiner*—James H. Cho
(74) *Attorney, Agent, or Firm*—Mark A. Haynes; Haynes Beffel & Wolfeld LLP

(57) ABSTRACT

Output drivers do not generate current when the pull up and pull down circuits are producing control signals which are below the turn on thresholds. Accordingly, no noise is translated to the output of the device in this period of time. Accordingly, an initial drive interval is provided in which the pull up and pull down control signals are driven with higher current so that the corresponding signal changes at a higher rate of speed before it reaches the turn on thresholds. Near the turn on thresholds, the rate of change of the pull up and pull down control signals is controlled to minimize noise during the transition and thereafter. A tristate output driver with a pull up signal and pull down signal pre-driver circuit uses a method for producing a pull up signal which includes causing a transition of the pull up signal from a starting level of the pull up signal to near the pull up threshold at a first rate of change, and a driving the pull up signal to an ending level beyond the pull up threshold at a second rate of change which is slower than the first-rate change. In a similar fashion, the method includes causing a transition of the pull down signal from a starting level of the pull down signal to near the pull down threshold at a third rate of change, and driving the pull down signal to an ending level beyond the pull down threshold at a fourth rate of change which is slower than the third rate of change.

13 Claims, 6 Drawing Sheets

OUTPUT BUFFER DRIVE CIRCUIT WITH INITIAL DRIVE FOR SEMICONDUCTOR DEVICES

BACKGROUND OF THE INVENTION

1. Field of the Invention

The present invention relates to integrated circuit devices, particularly integrated circuit memory devices, having output terminals, and to circuitry for driving the output terminals to reduce the time needed to drive output signals on such output terminals.

2. Description of Related Art

Integrated circuits have output terminals, typically referred to as output pads, on which signals are driven for access by external circuitry. The output pads typically have significant capacitance. For this reason output driver circuitry is included that uses large transistors to drive the output pads, or that consumes a significant amount of time in driving in the output pads to the desired signal level. As integrated circuits become more complex, and operate at higher speeds, the area and speed trade-off involved in the output drivers becomes more critical.

For integrated circuit memory devices, the read access time is becoming a critical parameter. The read access time is measured from the beginning of a read cycle until the time that data is available on the output pads for use by the external circuitry.

One factor in read access time depends on the speed of operation of the output drivers. So output drivers are designed with relatively high current circuits to achieve high speed switching. However, high speed switching is prone to noise problems. So pre-driver circuits which drive the output drivers have been designed to reduce noise. However, reducing noise typically involves controlling the rise and fall times of the control signals, which limits the speed of operation. Basically, for high speed switching, a fast current change is needed in the pre-driver circuit. However, noise produced is increased with the rate of change of the current. So contradictory design goals are presented, which require a tradeoff between noise levels and speed.

Background concerning technology that has been developed to address the problems of noise in output drivers can be found in U.S. Pat. No. 5,021,684 entitled PROCESS, SUPPLY, TEMPERATURE COMPENSATING CMOS OUTPUT BUFFER; and U.S. Pat. No. 4,823,029 entitled NOISE CONTROLLED OUTPUT BUFFER.

It is desirable to provide for fast switching of output drivers with reduced noise, suitable for use in large scale integrated circuit memory devices.

SUMMARY OF THE INVENTION

The present invention arises from the recognition that output drivers do not generate current when the pull up and pull down circuits are producing control signals which are below the turn on thresholds. Accordingly, no noise is translated to the output of the device in this period of time. Accordingly, an initial drive interval is provided by the present invention in which the pull up and pull down control signals are driven with higher current so that the corresponding signal changes at a higher rate of speed before it reaches the turn on thresholds. Near the turn on thresholds, the rate of change of the pull up and pull down control signals is controlled to minimize noise during the transition and thereafter. A significant speed increase can be achieved with little or no impact on the noise levels generated in the output driver.

Thus, the present invention provides a method for producing a pull up signal and a pull down signal for an output driver responsive to the pull up signal and the pull down signal to produce an output signal at a data output having a high-level when the pull up signal is asserted beyond a pull up threshold, and having a low-level when the pull down signal is asserted beyond a pull down threshold. The method comprises causing a transition of the pull up signal from a starting level of the pull up signal to near the pull up threshold at a first rate of change, and a driving the pull up signal to an ending level beyond the pull up threshold at a second rate of change which is slower than the first-rate change. In a similar fashion, the method includes causing a transition of the pull down signal from a starting level of the pull down signal to near the pull down threshold at a third rate of change, and driving the pull down signal to an ending level beyond the pull down threshold at a fourth rate of change which is slower than the third rate of change.

According to another aspect of the invention, an output circuit for an integrated circuit is provided. The output circuit includes a driver to supply an output signal to an output in response to a control signal. The driver causes a transition in the output signal when the control signal reaches a threshold level. A pre-driver generates the control signal, and includes a first circuit which causes a transition of the control signal from a starting level to near the threshold level at a first rate of change, and a second circuit which drives the control signal to an ending level at a second rate of change which is slower than the first rate of change.

In one embodiment, the second circuit includes a current path having a resistance limiting the rate of change of current driving the transition of the control signal. In this embodiment, the first circuit includes a current path bypassing the resistance while the control signal has a level between the starting level and the threshold level.

In yet another embodiment, the first circuit comprises a component having a capacitance, and a circuit for pre-setting a charge on the capacitance prior to the transition of the control signal. In this embodiment, the capacitance provides charge for accelerating the rate of change of current driving the transition of the control signal as the control signal transitions from the starting level to near the threshold level.

According to a further aspect of the invention, an integrated circuit memory device is provided having a data output. The device comprises a memory array and read circuitry coupled to the memory array to read data in the array and supply a data signal indicating the read data. An output driver is provided which is responsive to a pull up signal and a pull down signal to produce an output signal at the data output. The driver provides a high-level output signal when the pull up signal is asserted beyond a pull up threshold, and provides a low-level output signal when the pull down signal is asserted beyond a pull down threshold. In a one embodiment, when the pull up signal and the pull down signal have a particular combination of levels, then a high impedance is presented to the data output. A pre-driver is coupled to the read circuitry which generates the pull up signal and the pull down signal. The pre-driver includes a first circuit which causes a transition of the pull up signal from a starting level of the pull up signal to near the pull up threshold at a first rate of change, and a second circuit which drives the pull up signal to an ending level beyond the pull up threshold at a second rate of change which is slower than the first rate of change. A third circuit is included in the pre-driver which causes a transition of the pull down signal from a starting level of the pull down signal to near the pull down threshold at a third rate of change, and a fourth circuit which drives the pull down signal to an ending level beyond a pull down threshold at a fourth rate of change which is slower than the third rate of change.

Accordingly, the present invention provides for implementation of high-speed integrated circuit memory devices and other integrated circuits with low noise output drivers. The time interval before current is being driven by the output drivers on such devices is utilized for fast driving of the control signals. When the control signals near or reach the threshold at which current begins to be driven by the output drivers then a lower noise, controlled phase of the control signal transition is implemented.

Other aspects and advantages of the present invention can be seen on review of the figures, the detailed description, and the claims which follow.

DETAILED DESCRIPTION

Figure 1:
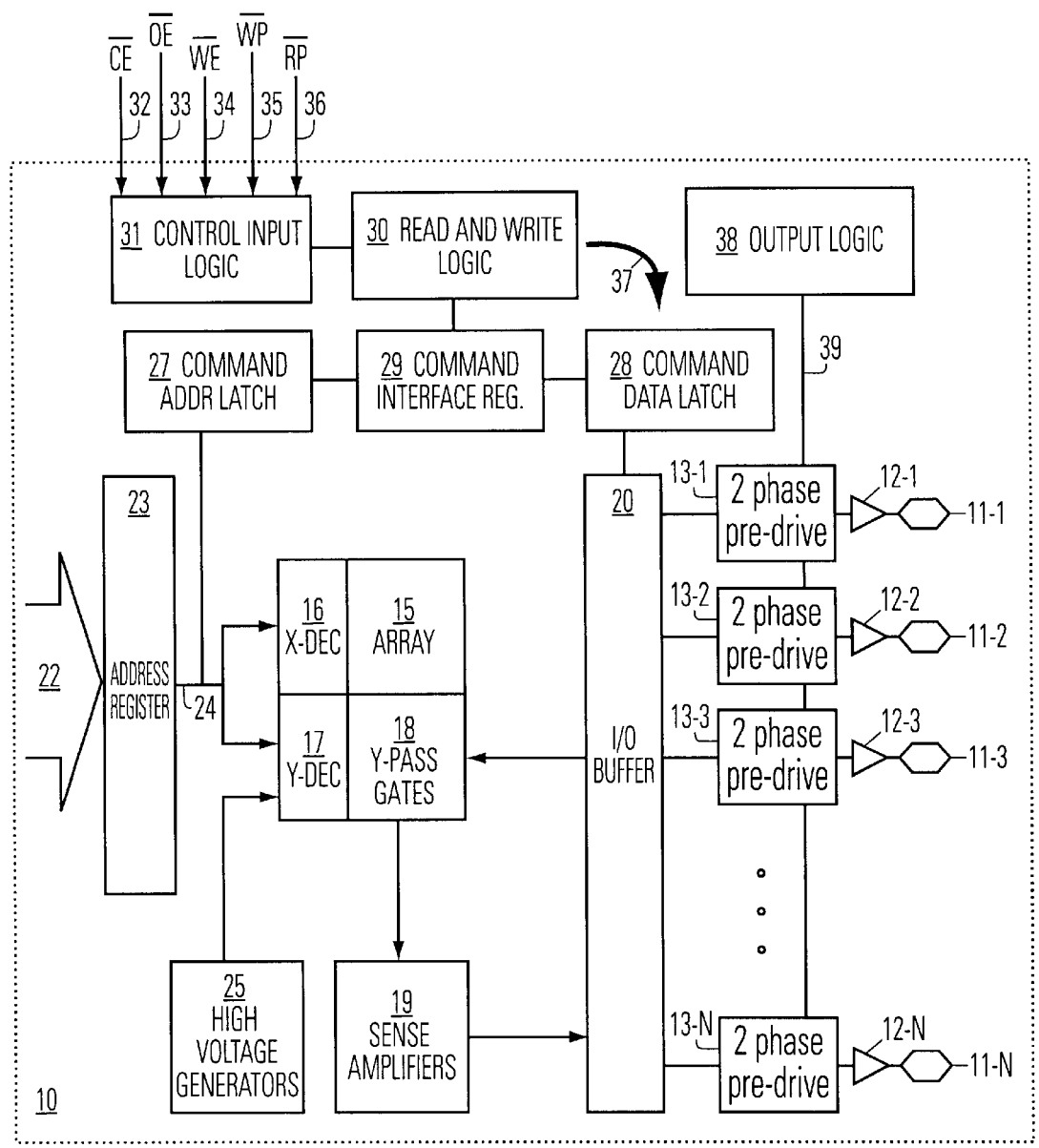
FIG. 1 is a block diagram of an integrated circuit memory device having the output driver with an initial drive circuit of the present invention.

A detailed description of the present invention is provided with reference to the figures. FIG. 1 shows an integrated circuit memory device 10, having a plurality of output pads 11-1 through 11-N, driven by a corresponding plurality of output driver circuits 12-1 through 12-N. According to the present invention, each output driver 12-1 through 12-N is also coupled to an two phase initial drive circuit 13-1 through 13-N, which includes pull up and pull down circuits operating in an initial fast transition stage and an ending controlled transition stage.

In the embodiment shown, the integrated circuit 10 is a memory device including an array 15 of storage cells. An x-decoder 16 is coupled to the array. A plurality of y-pass gates 18 are coupled to the y-decoder 17 and to bit lines through the array 15. The pass gates are coupled to a set of sense amplifiers 19 and to an input/output buffer 20. The input/output buffer 20 drives the input/output drivers 12-1 through 12-N. The input/output buffer 20 also provides input data through the y-pass gates 18 into the array 15. The integrated circuit 10 includes address inputs 22 which are coupled to address register 23. The address register 23 supplies addresses on line 24 to the x-decoder 16 and to the y-decoder 17.

The embodiment shown comprises a floating date memory device, such as a flash memory. In this embodiment, high voltage generators 25 are coupled to the array 15 for use in the program and erase operations. Alternative embodiments include read-only memory arrays, SRAM arrays, DRAM arrays, or other types of memory devices, or other high speed integrated circuits.

In the embodiment shown, the integrated circuit 10 includes a command address latch 27 and a command data latch 28 which are respectively coupled to the address register 23 and the I/O buffer 20. The command address latch and the command data latch are coupled to a command interface register 29, which is in turn coupled to read and write control logic 30. The integrated circuit is responsive to sequences of address and data signals to control the mode of operation of the device, as known in the art. Additional control logic on the integrated circuit including control input logic 31 receives a set of external control signals including a chip enable signal on line 32, and output enable signal on line 33, a write enable signal on line 34, and other control signals on lines 35 and 36.

The read and write control logic 30 produces control signals on line 37 which are distributed among components of the chip for controlling the operation of the device. In FIG. 1, an output logic block 38 is shown to represent the portions of the control logic which produce control signals on line 39 for controlling the output drivers 12-1 through 12-N and the pre-driver circuits 13-1 through 13-N.

In the preferred system, the control signals on line 39 include tristate enable signals for controlling the output drivers 12-1 through 12-N, and output enable signals or other signals which indicate the beginning of a data output event such as a read cycle.

Figure 2:
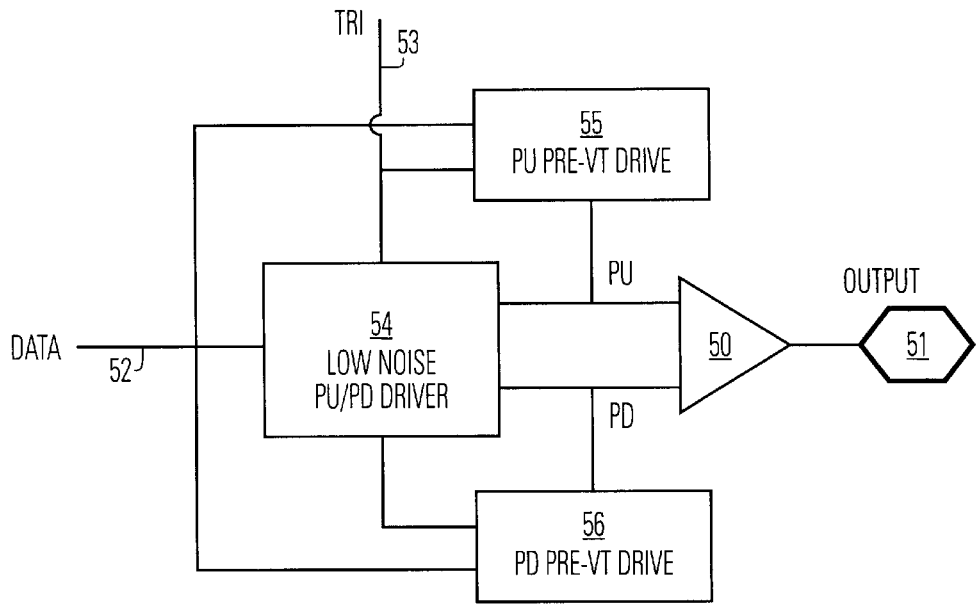
FIG. 2 is a simplified diagram of an output driver and predriver according to the present invention.

FIG. 2 provides an expanded diagram of the two phase predriver according to the present invention with an output driver 50 coupled to an output pad 51. The output driver 50 is responsive to a pull up signal PU and a pull down signal PD to produce an output. The pull down signal PD and the pull up signal PU are produced in response to a data signal DATA on line 52 and a tristate signal TRI on line 53. The data signal DATA on line 52 is supplied in one embodiment by read circuitry on an integrated circuit memory device utilizing the driver of the present invention. The tristate signal TRI on line 53 in this example is produced by output control circuitry on the integrated circuit.

When the output on the pad 51 is to be driven to a high voltage, the pull up signal PU is asserted by driving it beyond a pull up threshold voltage. Typically the threshold is a low voltage, and the pull up signal PU is driven down from a starting level near the supply potential to an ending level beyond the pull up threshold. At the same time, the pull down signal PD is driven to a level which does not exceed the pull down threshold. Conversely when the output on the pad 51 is to be driven to a low voltage, the pull down signal PD is driven from a starting level near ground to an ending level beyond the pull down threshold above the ground potential, while the pull up signal PU is to a level which is not beyond the pull up threshold.

According to the present invention, a predriver circuit produces the pull up signal PU and the pull down signal PD. A predriver circuit includes a low noise pull up/pull down driver 54 and a pull up prethreshold driver 55 coupled to the pull up signal, and a pull down prethreshold driver 56 coupled to the pull down signal. Operation of the predriver circuit can be understood will readily after a description of a typical output driver 50.

Figure 3:
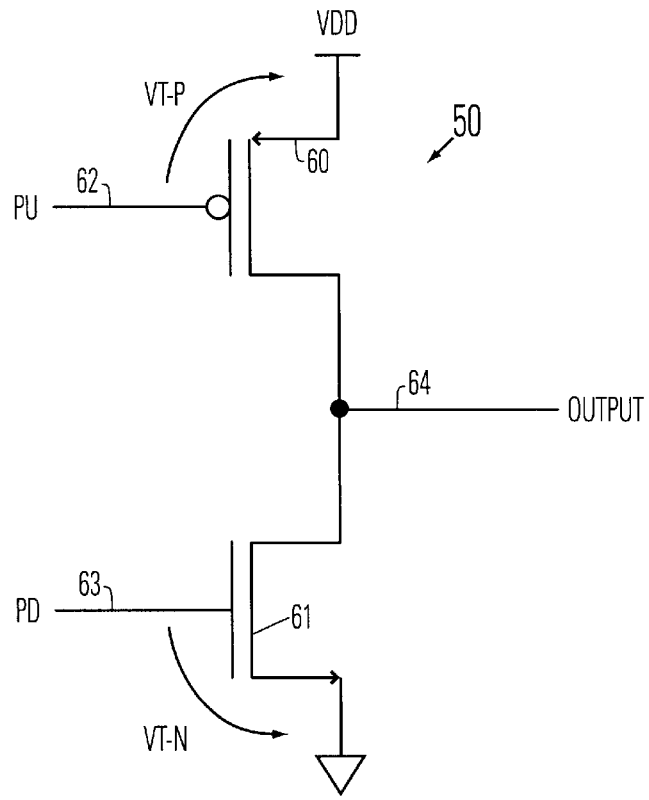
FIG. 3 is a simplified circuit diagram illustrating threshold levels of an output driver.

A representative output driver 50 is illustrated in FIG. 3. The output driver 50 includes a p-type transistor 60 and an n-type transistor 61. The pull up signal is supplied on line 62 at the gate of the p-type transistor 60. The pull down signal is supplied on line 63 to the gate of the n-type transistor 61. The source of the p-type transistor 60 is coupled to the supply potential and the source of the n-type transistor 61 is coupled to ground. The drains of the p-type transistor 60 and the n-type transistor 61 are coupled to line 64 to provide the output signal.

Thus, when the pull up signal on line 62 falls more than a pull up threshold of VT-P below the voltage on the source of the P-type transistor 60, while the pull down signal on line 63 falls below the pull down threshold of VT-N of the n-type transistor 61, the output 64 is pulled up. When the pull down signal on line 63 rises more than the pull down threshold VT-N above the voltage on the source of the n-type transistor 61, while the pull up signal on line 62 rises above the pull up threshold of VT-P of the p-type transistor 60, the output is driven low. A high impedance state is established when the pull up signal on line 62 is above the pull up threshold, and the pull down signal on line 63 is below the pull down threshold.

These examples assume that the pull up threshold is a low level measured relative to the supply potential, and the pull down threshold is a high level measured relative to ground. Other circuits having other combinations of pull up and pull down thresholds may also benefit from the present invention. For example, the pull up and pull down thresholds may be both high levels relative to ground.

Figure 4:
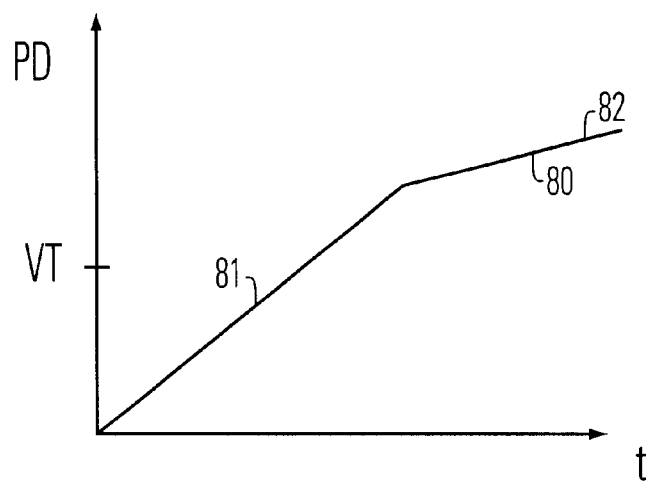
FIG. 4 illustrates the prior art voltage transition for a pull down signal.

FIG. 4 is a graph showing a typical voltage vs. time trace 80 for a pull down signal PD, according to the prior art. In order to maintain low noise, the pull down signal PD is driven at a relatively constant rate during the segment 81 past the threshold voltage which turns on the pull down transistor. Well past the threshold, the rate of increase of the pull down signal reduces as it reaches a maximum level approaching to supply potential in the segment of the trace labeled 82. The amount of noise produced on the output 61 of the output driver shown in FIG. 3 is directly related to the rate of change of the current driving the pull down signal PD. Thus, a high rate of change in the current driving the pull down signal on line 63 will induce greater noise on the output 64. This limits the speed of operation of the device utilizing the output driver.

Figure 5:
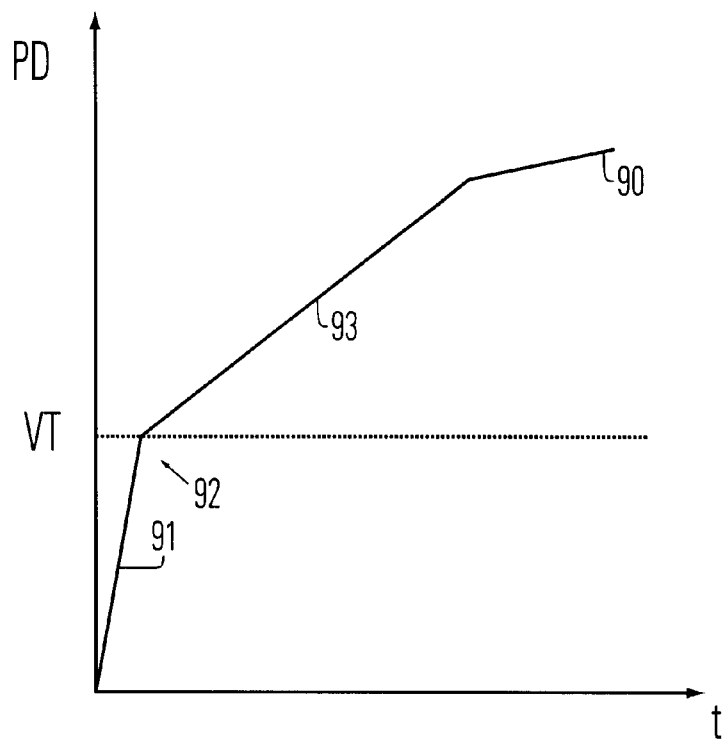
FIG. 5 is a graph illustrating the pull down voltage generated according to the present invention.

FIG. 5 is a graph showing the voltage vs. time trace 90 for the a pull down signal according to the present invention, using a pre-threshold driver combined with a low noise driver has shown in FIG. 2. A similar graph showing the pull up signal is not shown, because it is essentially the same in substance as the pull down signal. During the segment 91 of the trace 90, the pull down prethreshold driver 56 drives the pull down signal very quickly to a level 92 which is at or near the pull down threshold VT. Thereafter, the low noise driver 54 controls the rate of change of the pull down signal PD during the segment 93. Finally, the rate of change trails off as the pull down signal PD reaches a maximum level. It can be seen in FIG. 5 that the pull down signal PD reaches the threshold level much more quickly than is possible using the prior art driver. It is found in practice that as much as 3 ns read speed (from chip enable signal or address signal transition to data output) is earned using a prethreshold driver, without inducing additional noise in the output.

Figure 6:
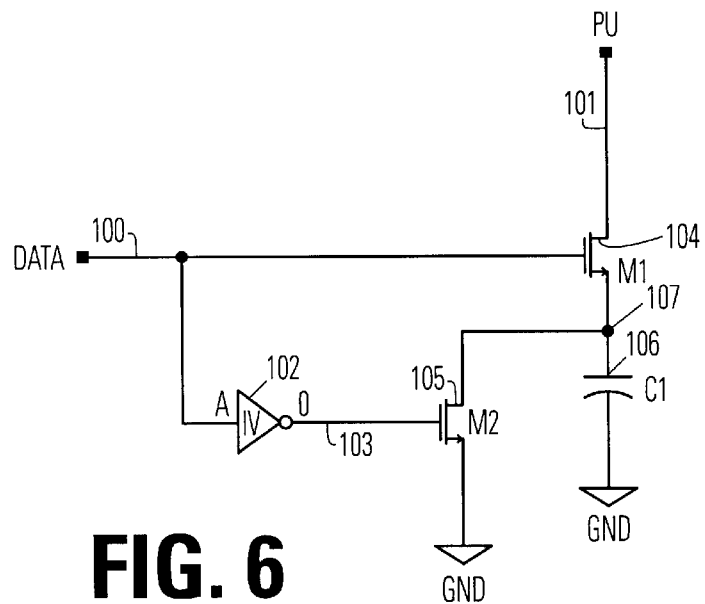
FIG. 6 is a diagram of a predriver circuit for producing a pull up signal having two stages according to the present invention.

FIG. 6 illustrates one example circuit which can be utilized as a prethreshold driver for a pull up signal according to the present invention. The circuit receives a data signal DATA on line 100 and provides prethreshold driving current to line 101 on which the pull up signal is generated. The data signal on line 100 is supplied as an input to invertor 102 which produces the inverse of the data signal on line 103. A first transistor 104 has a drain coupled to line 101 and a source coupled to node 107. The gate of transistor 104 is connected to the data signal on line 100. The second transistor 105 as its drain coupled to node 107 and its source coupled to ground. The gate of transistor 105 is coupled to the inverse of the data signal on line 103. A component 106 having a capacitance, such as a MOS capacitor, is coupled from node 107 to ground. In operation, when the data signal is low, transistor 105 is on which sets the charge on a capacitance of component 106 to establish a ground voltage at node 107. When the data signal goes high, transistor 105 turns off and transistor 104 turns on. The charge in the component 106 quickly pulls the pull up signal on line 101 towards ground. The size of the capacitance is selected so that the majority of the charge is applied to the pull up signal before the pull up signal reaches a level at or near the pull up threshold. In this manner, the circuit of FIG. 6 provides the initial prethreshold drive for the pull up signal. The low noise driver then takes over.

Figure 7:
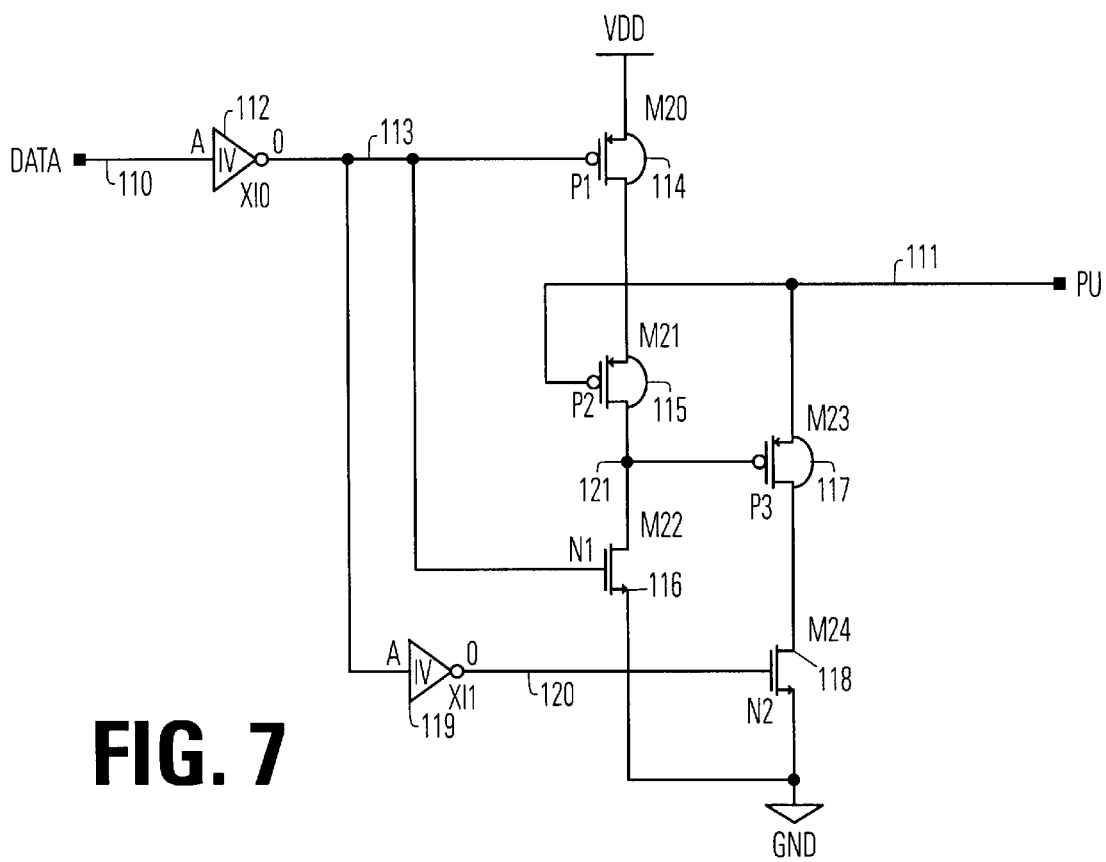
FIG. 7 is an alternative implementation of a predriver circuit for producing a pull up signal having two stages according to the present invention.

FIG. 7 illustrates another example circuit which could operate as a prethreshold driver for a pull up signal. The circuit receives the data signal on line 110 and provides prethreshold driving current to line 111 on which the pull up signal is generated. The circuit includes invertor 112 which is coupled to line 110. The invertor 112 supplies inverse of the data signal on line 113. The invertor 119 has the inverse of the data signal supplied as input and reproduces the data signal on line 120. The circuit includes p-type transistors 114, 115 and 117. The circuit includes n-type transistors 116 and 118. P-type transistor 114 has its source coupled to the supply potential, its gate coupled to line 113, and its drain coupled to the source of P-type transistor 115. The gate of p-type transistor 115 is coupled to line 111. A drain of P-type transistor 115 is coupled to node 121. N-type transistor 116 has its drain coupled to node 121, its gate coupled to line 113, and its source coupled to ground. P-type transistor 117 has a source coupled to line 111, its gate coupled to node 121, and its drain coupled to the drain of N-type transistor 118. The gate of N-type transistor 118 is coupled to line 120, and the source of N-type transistor 118 is coupled to ground.

In operation, when the data signal is to be driven high, the pull up signal on line 111 is pulled from a starting level near the supply potential towards ground. Thus, when the data signal on line 110 transitions to a high state, the signal on line 113 goes low, and a signal on line 120 goes high. When the signal on line 113 is low, transistor 116 is off, and transistor 118 is on. A transistor 117 remains on as its gate has been precharged to a level near ground, and transistor 115 remains off so long as the pull up signal on line 111 is high. This current path through transistors 117 and 118 drives the pull up signal on line 111 down. When the pull up signal on line 111 falls below the turn on threshold of transistor 115, the voltage on node 121 is pulled high, turning off the prethreshold driver circuit.

Figure 8:
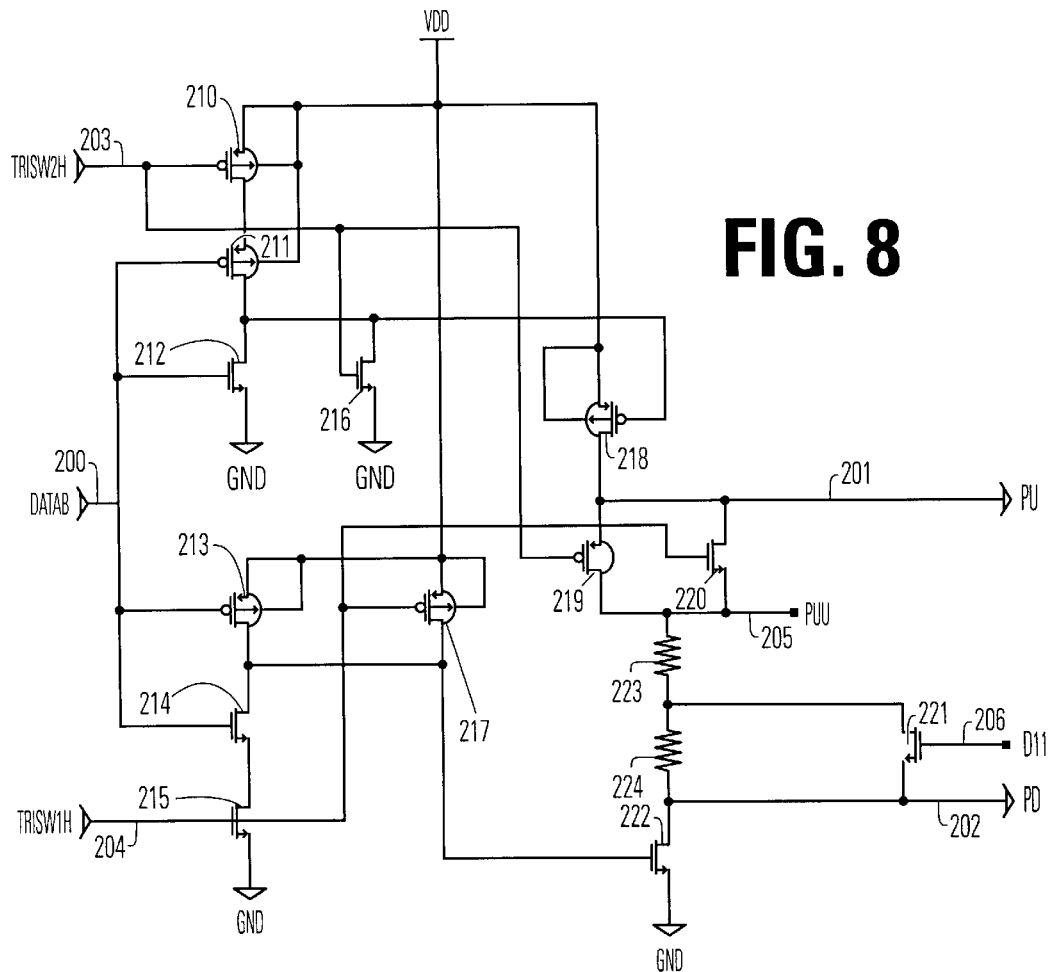
FIG. 8 and FIG. 9 together provide a circuit diagram of a preferred embodiment of a predriver according to the present invention.
Figure 9:
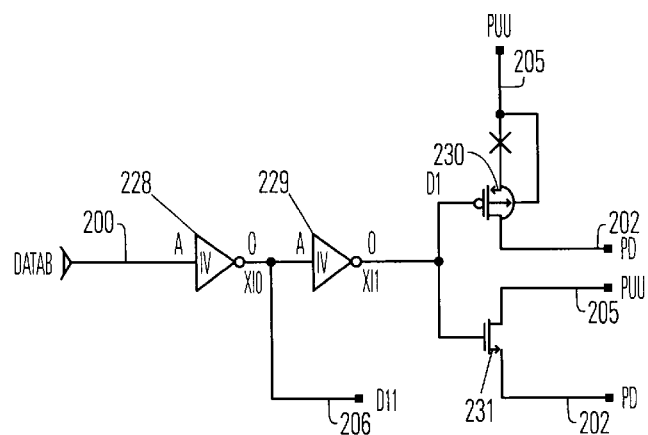

FIG. 8 is a circuit diagram of one preferred embodiment of a low noise predriver circuit for a tristate output buffer according to the present invention. FIG. 9 shows the prethreshold drivers for the pull up and pull down signals according to the present invention. The circuit in FIG. 8 receives the data signal DATAB on line 200 and produces a pull up signal on line 201 and a pull down signal on line 202. Tristate control signals TRISW2H and TRISW1H are received on lines 203 and 204. Control nodes PUU and D11 at lines 205 and 206 are labeled in FIG. 8, to which the prethreshold drivers of FIG. 9 are coupled.

The circuit of FIG. 8 includes transistors 210 through 222 and resistors 223 and 224. P-type transistor 210 has its source coupled to the supply potential, its gate coupled to the control signal TRISW2H and its drain coupled to the source of p-type transistor 211. The gate of p-type transistor 211 is coupled to the data signal on line 200 and its drain is coupled to the drain of n-type transistor 212. The gate of n-type transistor 212 is connected to the data signal on line 200 and its source is coupled to ground. The drain of transistor 212 is also coupled to the drain of transistor 216 and the gate of p-type transistor 218. P-type transistor 213 has its source and n-well coupled to the supply potential, its gate coupled to the data signal on line 200, and its drain coupled to the drain of n-type transistor 214. The gate of transistor 214 is coupled to the data signal on line 200 and its source is coupled to the drain of n-type transistors 215. The gate of transistor 215 is coupled the tristate control signal TRISW1H and its source is coupled to ground.

The drain of transistor 216 is coupled to the drain of transistor 212, and its gate is connected to the tristate control signal TRISW2H and its source is coupled to ground. The source of p-type transistor 217 is connected to the supply potential and its gate is coupled to the tristate control signal TRISW1H. The drain of p-type transistor 217 is connected to the gate of n-type transistor 222, and to the drain of transistor 214. P-type transistor 218 has its gate connected to the drain of transistor 212, its source and n-well connected to the supply potential, and its drain connected to line 201. P-type transistor 219 has its source connected to line 201, its gate connected to the tristate control signal TRISW2H and its drain connected to the node 205. N-type transistor 220 has its drain connected to line 201, its gate connected to the tristate control signal TRISW1H and its source connected to the node 205. Resistors 223 and 224 are connected in series between the node 205 and line 202. N-type transistor 221 has its drain connected to the node between resistors 223 and 224, its gate connected to the node 206, and its source coupled to the line 202. N-type transistor 222 has drain connected to line 202, its gate connected to the drain of transistor 214, and its source coupled to ground.

Figure 10:
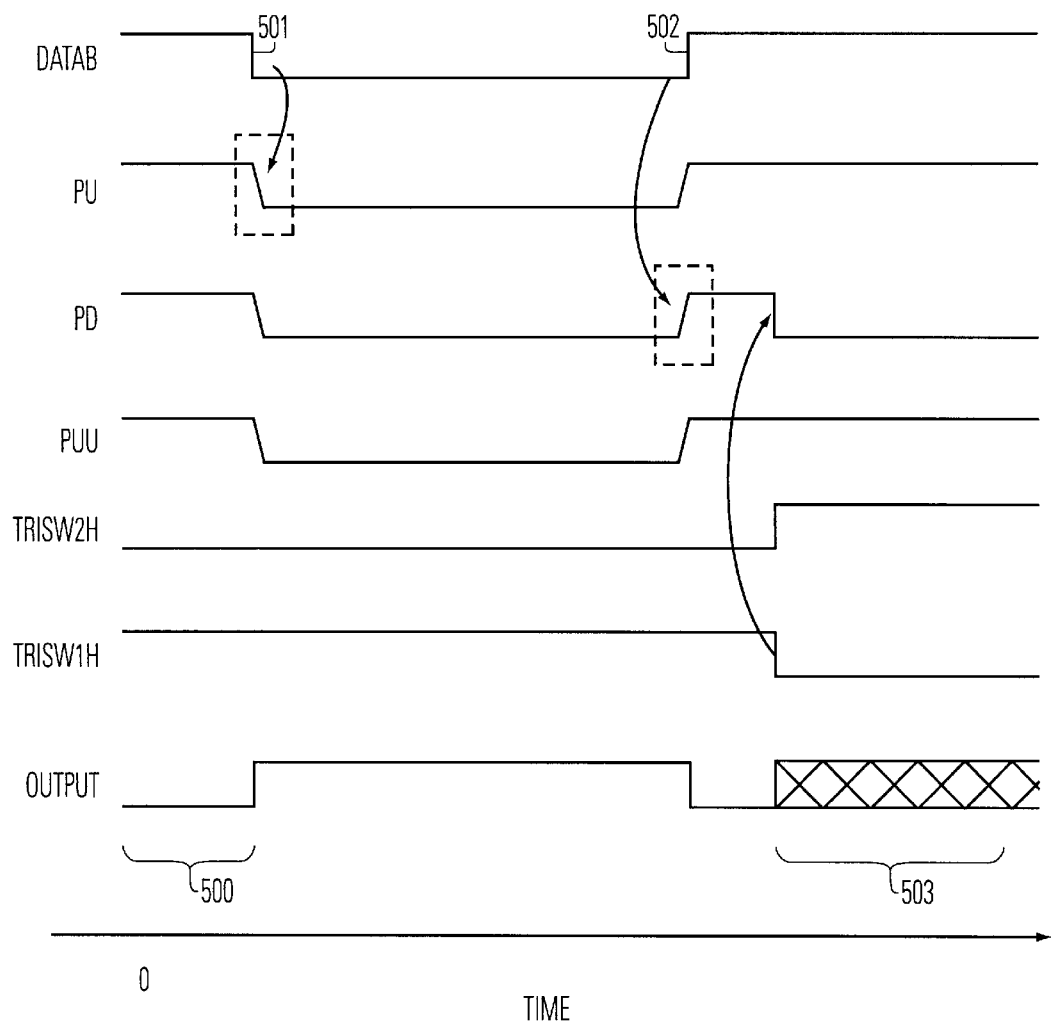
FIG. 10 is a simplified timing diagram used for illustrating the operation of the circuit of FIGS. 8 and 9.

Operation of the circuit in FIG. 8 can be understood with reference to the signal diagram in FIG. 10. The tri-state control signals on lines 203 and 204 are low and high, respectively, during normal operation. Thus, transistors 210, 219, 215, and 220 are on. When the data signal on line 200 is high, the pull up signal on line 201 is high and the pull down signal on line 202 is high. The signal PUU at node 205 is likewise at a high level. The output of an output driver driven by the pull up and pull down signals in this state would be low. This state is represented by the interval 500 in the circuit of FIG. 10. When the data signal transitions to a low state at point 501, transistors 211 and 213 turn on. This pulls the gate of transistor 218 high. In a similar fashion, this pulls the gate of transistor 222 high. Thus, a current path is established between the pull up signal on line 201, and ground. The rate of change of the current as the pull up signal transitions from a starting level near the supply potential to a level below the pull up threshold of the output driver, is controlled by the resisters 223 and 224.

When the data signal transitions from a low state to a high state at point 502, the pull up signal and the pull down signal are driven high. An output signal driven by a output driver controlled by the pull up and pull down signals would go to a low state. In this case, when the data signal goes a high state, transistors 212 and 214 turn on. This pulls the gate of transistor 218 low and the gate of transistor 222 low. This turns off transistor 222 and turns on transistor 218 driving the pull up signal to a high state and the pull down signal to a high state. The rate of change of the pull down signal is controlled by the resisters 223 and 224 in this transition. Transistor 221 operates to remove the resister 224 from the circuit when the signal D11 is high. D11 is the inverse of the data signal on line 200, and generated in the circuit of FIG. 9.

When tri-state output is desired, the tri-state control signal TRISW2H on line 203 is pulled high and the tri-state control signal TRISW1H on line 204 is pulled low as indicated in the interval 503 of FIG. 10. This causes transistor 216 to turn on, pulling the gate of transistor 218 low. This pulls the pull up signal on line 201 to a high state. Likewise, transistor 217 is turn on. This pulls the gate of transistor 222 high and drives the pull down signal on line 202 to a low state. At the same time, transistors 219 and 220 are turned off.

The circuit in FIG. 8 provides a low noise predriver circuit for the pull up and pull down signals. FIG. 9 illustrates the prethreshold driver according to the present invention. The data signal on line 200 is applied to inverter 228. The output of inverter 228 is applied on line 206 as the control signal D11. Also, the output of inverter 228 is applied to inverter 229. The output of inverter 229 is connected to the gate of a p-type transistor 230, and to the gate of an n-type transistor 231. The transistors 230 and 231 are connected in parallel across the node PUU on line 205, and the pull down signal PD on line 202. For the transition of the pull up signal from the high state to the low state, the output of inverter 229 transitions to a low state turning on transistor 230 and turning off transistor 231. Transistor 230 conducts current with low impedance bypassing the resisters 223 so long as the signal PUU on line 205 remains a level more than a threshold voltage below the signal on the gate of transistor 230. When PUU falls below that level, transistor 230 ceases conducting current, and the low noise current path through resister 223 takes over. (Transistor 221 is on bypassing resister 234 for this transition.)

Likewise, when the data signal transitions from the low state to the high state, transistor 231 turns on. Transistor 231 remains conducting with low impedance so long as the pull down signal on line 202 remains more than a threshold below the data signal on its gate. When the pull down signal reaches the threshold level of transistor 231, current no longer is conducted through transistor 231 and the low noise current path through the resisters 223 and 224 takes over the pull up of the pull down signal on line 202.

The following table provides example transistor sizes and resister values for the circuit of FIGS. 8 and 9. The circuit components are merely representative of one implementation, and may not be optimal for any given instance of the circuit. The components chosen can be varied according to the needs of a particular manufacturing process or particular design goals as well known in the art.

EXAMPLE COMPONENT TABLE
FIGS. 8 and 9

| COMPONENT | VALUES |
| --- | --- |
| p-type transistor 210 | Length: 0.75 µ Width: 18 µ |
| p-type transistor 211 | Length: 0.75 µ Width: 18 µ |

-continued

EXAMPLE COMPONENT TABLE
FIGS. 8 and 9

| COMPONENT | VALUES |
| --- | --- |
| n-type transistor 212 | Length: 0.75 μ<br>Width: 7.5 μ |
| p-type transistor 213 | Length: 0.75 μ<br>Width: 15 μ |
| n-type transistor 214 | Length: 0.75 μ<br>Width: 15 μ |
| n-type transistor 215 | Length: 0.75 μ<br>Width: 15 μ |
| n-type transistor 216 | Length: 0.75 μ<br>Width: 4 μ |
| p-type transistor 217 | Length: 0.75 μ<br>Width: 7.5 μ |
| p-type transistor 218 | Length: 0.75 μ<br>Width: 55 μ |
| p-type transistor 219 | Length: 0.75 μ<br>Width: 23 μ |
| n-type transistor 220 | Length: 0.75 μ<br>Width: 23 μ |
| n-type transistor 221 | Length: 0.75 μ<br>Width: 5 μ |
| n-type transistor 222 | Length: 0.75 μ<br>Width: 25 μ |
| resister 223 | 997.5 ohms |
| resister 224 | 1395 ohms |
| inverter 228 | Lengths: P/N: 0.5 μ<br>Widths:<br>P: 4 μ,<br>N: 2 μ |
| inverter 229 | Lengths: P/N: 0.5 μ<br>Widths:<br>P: 4 μ,<br>N: 2 μ |
| p-type transistor 230 | Length: 0.75 μ<br>Width: 50 μ |
| n-type transistor 231 | Length: 0.75 μ<br>Width: 15 μ |

Thus the present invention provides a method for producing a pull up signal and a pull down signal for an output driver that is responsive to the pull up signal and the pull down signal to produce an output signal for a data output. The output driver is characterized by having a high level when the pull up signal is asserted beyond a pull up threshold and having a low level when the pull down signal is asserted beyond a pull down threshold. The method comprises causing a transition of the pull up signal from a starting level of the pull up signal to near the pull up threshold at a first rate of change, by boosting the current supplied to the pull up signal driver, and driving the pull up signal to an ending level beyond the pull up threshold at a second rate of change which is slower than the first rate of change, by providing a noise controlled current source to drive the pull up signal. Further, the method comprises causing a transition of the pull down signal from a starting level of the pull down signal to near the pull down threshold at a third rate of change by boosting the current supplied to the pull down signal driver, and then driving the pull down signal to an ending level beyond the pull down threshold at a fourth rate of change which is slower than the third rate of change by providing a noise controlled current source to drive the pull down signal. Of course the first and third rates of change may be the same or different. Likewise the second and fourth rates of change may be the same or different.

Accordingly, an output driver circuit, and a method for producing an output signal, are provided with a pull up signal and pull down signal predriver which operates with high current during an initial phase until the turn on threshold of the corresponding signal is reached, and controlled current in a finishing phase after the output driver begins conducting current. This enables the implementation of higher speed output drivers with reduced noise, The output driver of the present invention is preferably implemented in an integrated circuit memory device. However, it can be utilized on any type of high-speed integrated circuit.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the appended claims.

What is claimed is:

1. An output circuit for an integrated circuit, comprising:
a driver to supply an output signal for an output in response to a control signal, the driver causing a transition in the output signal when the control signal reaches a threshold level; and
a pre-driver which generates the control signal, the pre-driver including a first circuit which causes a transition of the control signal from a starting level to near the threshold level at a first rate of change, a second circuit which drives the control signal to an ending level at a second rate of change which is slower than the first rate of change, the first circuit including a level detection component responsive to control signal so that the first circuit is disabled when control signal reaches a level near the threshold level.

2. The output circuit of claim 1, wherein the second circuit includes a current path having a resistance limiting a rate of change of current driving the transition of the control signal, and the first circuit includes a current path bypassing the resistance while the control signal has a level between the starting level and the threshold level.

3. The output circuit of claim 1, wherein the driver includes a pull up circuit and a pull down circuit, the pull up circuit being responsive to the control signal, and the pull down circuit being responsive to a second control signal to cause a transition in the output signal when the second control signal reaches a second threshold.

4. The output circuit of claim 3, wherein the pre-driver includes a third circuit which causes transition of the control signal from a starting level to near the second threshold level at a third rate of change, and a fourth circuit which drives the second control signal to an ending level at a fourth rate of change which is slower than the third rate of change.

5. The output circuit of claim 4, wherein the fourth circuit includes a current path having a resistance limiting a rate of change of current driving the transition of the second control signal, and the third circuit includes a current path bypassing the resistance while the second control signal has a level between the starting level and the threshold level.

6. The output circuit of claim 1, wherein the first circuit comprises a component having a capacitance, and a circuit for presetting a charge on the capacitance prior to the transition of the control signal.

7. An integrated circuit memory device having a data output; comprising:
a memory array;
read circuitry, coupled to the memory array, to supply a data signal indicating data read from the array;
an output driver responsive to a pull up signal and a pull down signal to produce an output signal for a data output having a high level when the pull up signal is asserted beyond a pull up threshold and having a low level when the pull down signal is asserted beyond a pull down threshold; and a pre-driver coupled to the read circuitry, which generates the pull up signal and the pull down signal, the pre-driver including a first circuit which causes a transition of the pull up signal from a starting level of the pull up signal to near the pull up threshold at a first rate of change, the first circuit including a level detection component responsive to pull up signal so that the first circuit is disabled when pull up signal reaches a level near the pull up threshold, a second circuit which drives the pull up signal to an ending level beyond the pull up threshold at a second rate of change which is slower than the first rate of change, a third circuit which causes transition of the pull down signal from a starting level of the pull down signal to near the pull down threshold at a third rate of change, the third circuit including a level detection component responsive to pull down signal so that the first circuit is disabled when pull up signal reaches a level near the pull down threshold, and a fourth circuit which drives the pull down signal to an ending level beyond the pull down threshold at a fourth rate of change which is slower than the third rate of change.

8. The device of claim 7, wherein the second circuit includes a current path having a resistance limiting a rate of change of a current driving the transition of the pull up signal, and the first circuit includes a current path bypassing the resistance while the pull up signal has a level between the starting level of the pull up signal and the pull up threshold.

9. The device of claim 7, wherein the fourth circuit includes a current path having a resistance limiting a rate of change of a current driving the transition of the pull down signal, and the third circuit includes a current path bypassing the resistance while the pull down signal has a level between the starting level of the pull down signal and the pull down threshold.

10. The device of claim 7, wherein the driver circuit is responsive to a particular combination of the pull up and pull down signal to present high impedance state for the data output.

11. The device of claim 7, wherein the first circuit comprises a component having a capacitance, and a circuit for presetting a charge on the capacitance prior to the transition of the pull up signal from the starting level of the pull up signal to near the pull up threshold.

12. The device of claim 7, wherein the third circuit comprises a component having a capacitance, and a circuit for presetting a charge on the capacitance prior to the transition of the pull down signal from the starting level of the pull down signal to near the pull down threshold.

13. A method for producing a pull up signal and a pull down signal for an output driver responsive to the pull up signal and the pull down signal to produce an output signal at a data output having a high level when the pull up signal is asserted beyond a pull up threshold and having a low level when the pull down signal is asserted beyond a pull down threshold, the method comprising:

causing a transition of the pull up signal from a starting level of the pull up signal to near the pull up threshold at a first rate of change, including detecting a level of the pull up signal during the transition;

driving the pull up signal to an ending level beyond the pull up threshold at a second rate of change which is slower than the first rate of change;

causing a transition of the pull down signal from a starting level of the pull down signal to near the pull down threshold at a third rate of change, including detecting a level of the pull down signal during the transition; and driving the pull down signal to an ending level beyond the pull down threshold at a fourth rate of change which is slower than the third rate of change.

* * * * *